United States Patent [19]

Harwood et al.

[11] Patent Number: 5,101,152
[45] Date of Patent: Mar. 31, 1992

[54] INTEGRATED CIRCUIT TRANSFER TEST DEVICE SYSTEM UTILIZING LATERAL TRANSISTORS

[75] Inventors: Vance R. Harwood, Loveland; Kevin W. Keirn, Boulder; John J. Keller, Loveland; Ronald J. Peiffer, Ft. Collins, all of Colo.

[73] Assignee: Hewlett-Packard Company, Palo Alto, Calif.

[21] Appl. No.: 472,926

[22] Filed: Jan. 31, 1990

[51] Int. Cl.$^5$ ............... G01R 31/00; G01R 31/28
[52] U.S. Cl. ............... 324/158 R; 324/73.1; 324/158 T; 340/653
[58] Field of Search ............... 324/158 R, 73.1, 158 T, 324/537, 555; 371/15.1, 16.1, 20; 437/8; 340/653, 656

[56] References Cited

U.S. PATENT DOCUMENTS

| | | | |
|---|---|---|---|
| 3,622,883 | 11/1971 | Haire | 324/158 T |
| 4,042,832 | 8/1977 | Cassarino, Jr. et al. | 340/653 |
| 4,245,331 | 1/1981 | Hamano et al. | 340/656 |
| 4,727,317 | 2/1988 | Oliver | 324/158 R |
| 4,779,041 | 10/1988 | Williamson, Jr. | 324/73.1 |
| 4,801,878 | 1/1989 | Peiffer et al. | 324/158 T |
| 4,864,219 | 9/1989 | Parsons | 340/653 |
| 4,894,605 | 1/1990 | Ringleb et al. | 324/537 |
| 4,896,108 | 1/1990 | Lynch et al. | 324/158 T |

Primary Examiner—Kenneth A. Wieder
Assistant Examiner—Vinh P. Nguyen

[57] ABSTRACT

Disclosed is a system for determining whether semiconductor components are present and properly connected to a printed circuit board. The semi-conductor material between two pins of an integrated circuit forms a lateral NPN transistor, having its base connected directly to the substrate connection pin of the component. A constant voltage source is applied to the lateral transistor collector pin of the component being tested, and allowed to stabilize. A current or voltage source is then connected to the emitter pin of the lateral transistor, typically an adjacent pin, and a current or voltage pulse is applied to this pin. The current on the collector pin is then monitored and if a corresponding current pulse is detected, the emitter and collector pins, as well as the substrate connection pin of the component, are properly connected to the printed circuit board.

12 Claims, 5 Drawing Sheets

INTEGRATED CIRCUIT TRANSFER TEST DEVICE SYSTEM UTILIZING LATERAL TRANSISTORS

FIELD OF THE INVENTION

This invention relates to measuring and testing devices and more particularly to in-circuit testing devices. Even more particularly, the invention relates to in-circuit testing of connections between an integrated circuit and a printed circuit board.

BACKGROUND OF THE INVENTION

It is important that electronic components and printed circuit boards be tested after the components have been soldered to the printed circuit boards. Several different approaches have been developed for testing the components and printed circuit boards, including functional testing, in-circuit testing, and manufacturing defect analyzers.

Functional testing uses a procedure of applying predetermined input signals and monitoring the output of a printed circuit board to determine if all of the components are present and operating properly on the circuit board. While functional testing provides a way of determining whether the P.C. board is functioning properly, it provides little or no information regarding the functioning of individual components on the board. Complex programming techniques have been used to provide limited information as to the location of non-functioning components on the board by carefully selecting input data and analyzing the output results. Such systems are complex, often costly to implement, and normally provide only vague information as to the location of malfunctioning components.

Because of the limitations of functional testing, in-circuit testing techniques have been used to individually test the components on the printed circuit board to determine if these components are working properly. This process uses a "bed of nails" tester to access each individual component and test that component individually. In this manner, non-functioning components can be identified and replaced to prevent the entire circuit board from being scrapped. This process works well for simple components where circuit inside the component is known and can be easily tested. If the component being tested is very complex, or if the circuit inside the component is unknown, in-circuit testing may not achieve satisfactory results.

Manufacturing defect analyzers are another class of testing devices that provide simpler tests and are less expensive to implement. These devices are designed to locate manufacturing faults, such as shorts on a printed circuit board, missing integrated circuits, bent component pins, etc. Although these devices do a reasonably good job of finding shorts and gross analog faults, they are marginal when testing digital sections of the board.

One very important potential problem that must be tested on every printed circuit board is whether all the pins of every component are soldered to the circuit board. Functional testing may miss a particular pin, if the functions performed by that particular pin are not thoroughly tested in functional test. Testing for this type of fault is particularly difficult when the circuit inside the component is unknown, such as the case with application specific integrated circuits (ASICs). Because of the large number of ASICs and the complexity of these devices, it is often not feasible to design an in-circuit test or a functional test to isolate this particular component.

The device of U.S. Pat. No. 4,779,041, issued Oct. 18, 1988 to Williamson, attempts to solve the above described problem. The device and test method of Williamson models a general circuit inside the device as a pair of diodes having a common resistor. This resistor is created by the wire between the device components and the external ground pin of the device. A current is passed through one of the diodes using a constant current source, to forward bias the diode. A large current pulse is then applied to the other of the diodes. The large current pulse will cause a voltage drop across the common resistor, and this voltage drop can be measured to determine whether all three pins are connected. The device of Williamson, however, suffers some limitations. Because the value of the common resistor is small, a large current pulse is needed to measure an appreciable voltage drop. Also, some current passes through adjacent devices connected to the pins, thus lowering the amount of current through the common resistor. In addition, if several pins are connected to ground in the device under test, the resistance of all these pins is placed in parallel with the common resistor, again reducing the amount of voltage which can be measured.

There is need in the art then for a device and method which will measure whether all pins of a component are soldered to a circuit board. There is further need in the art for such a device and method which does not rely on the circuit contained in the component. A still further need is for such a device and method which does not depend on a common resistor between the pins being measured and an associated ground pin. Still another need is for such a device and method which is less sensitive to adjacent devices connected to the pins.

SUMMARY OF THE INVENTION

It is an object of the present invention to provide an apparatus and method to test for a connection between a pin of a component and a printed circuit board.

It is another object of the invention to provide such an apparatus and method that does not rely on the circuit contained inside the component.

Yet another object of the invention is to provide such an apparatus and method that is insensitive to fan out of the pin being tested.

Still another object of the present invention is to provide such an apparatus and method that is insensitive to the number of ground pins of the component being tested.

The above and other objects of the present invention are accomplished in a system that overcomes the disadvantages and limitations of the prior art by providing an apparatus and method for determining whether semiconductor components are present and properly connected to a printed circuit board. The present invention determines whether input and output connector pins, as well as a ground pin for bipolar semiconductor components and metal oxide semiconductor (MOS) components are conductively connected to a circuit on a printed circuit board, and whether proper conductive paths exist between the connector pins and the ground pin through the semiconductor.

In accordance with the present invention, the semiconductor material between two pins of an integrated circuit can be viewed as a lateral transistor, having its base connected directly to the semiconductor substrate pin of the component. The substrate is typically connected to the ground pin for digital components, and the most negative supply connection for analog components. A constant voltage source, such as might be supplied by an op amp and feedback network, is applied to a first pin of the component being tested. After the circuit has had time to stabilize, the current flowing into this first pin is measured. A current source is then connected to a second pin of the device, typically an adjacent pin, and a current pulse is applied to this second pin. The first pin, having the voltage source connected thereto, acts as a collector of the lateral transistor, and the second pin, having the current source connected thereto, acts as an emitter to the lateral transistor. Therefore, when a current pulse is applied to the second pin, the current on the first pin is monitored and if a corresponding current pulse is detected on the first pin, the first and second pins as well as the ground pin of the component are properly connected to printed circuit board.

Typically the voltage applied to the first pin described above, is provided by the inverting input to an op amp which has a feedback resistor connected from the output of the op amp to this same inverting input pin. The non-inverting input to the op amp is connected to a voltage source. Because of the nature of op amps, the inverting input will be maintained at the same voltage level as the non-inverting input. Therefore, this constant voltage will be supplied to the collector pin of the device under test. By measuring the voltage across the feedback resistor of the op amp, the current flowing into the pin of the device under test can be measured. When the current pulse is applied to the second pin of the device under test, the voltage across the feedback resistor of the op amp will indicate whether additional current flows into the device under test, and therefore whether the device under test is connected to the printed circuit board.

In an alternative embodiment, a negative voltage source is applied to the second pin to cause the current flow from the emitter of the lateral transistor.

The advantage of the present system is that it provides a simple and inexpensive system equivalent to a manufacturing defects analyzer for digital components such as TTL. It does not rely on the characteristics of the circuit within the device under test, and it is less sensitive than other methods to adjacent devices and to fan out of the pins in the device under test. This method is also less sensitive to the number of ground pins on the device under test than other methods.

BRIEF DESCRIPTION OF THE DRAWINGS

The above and other objects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
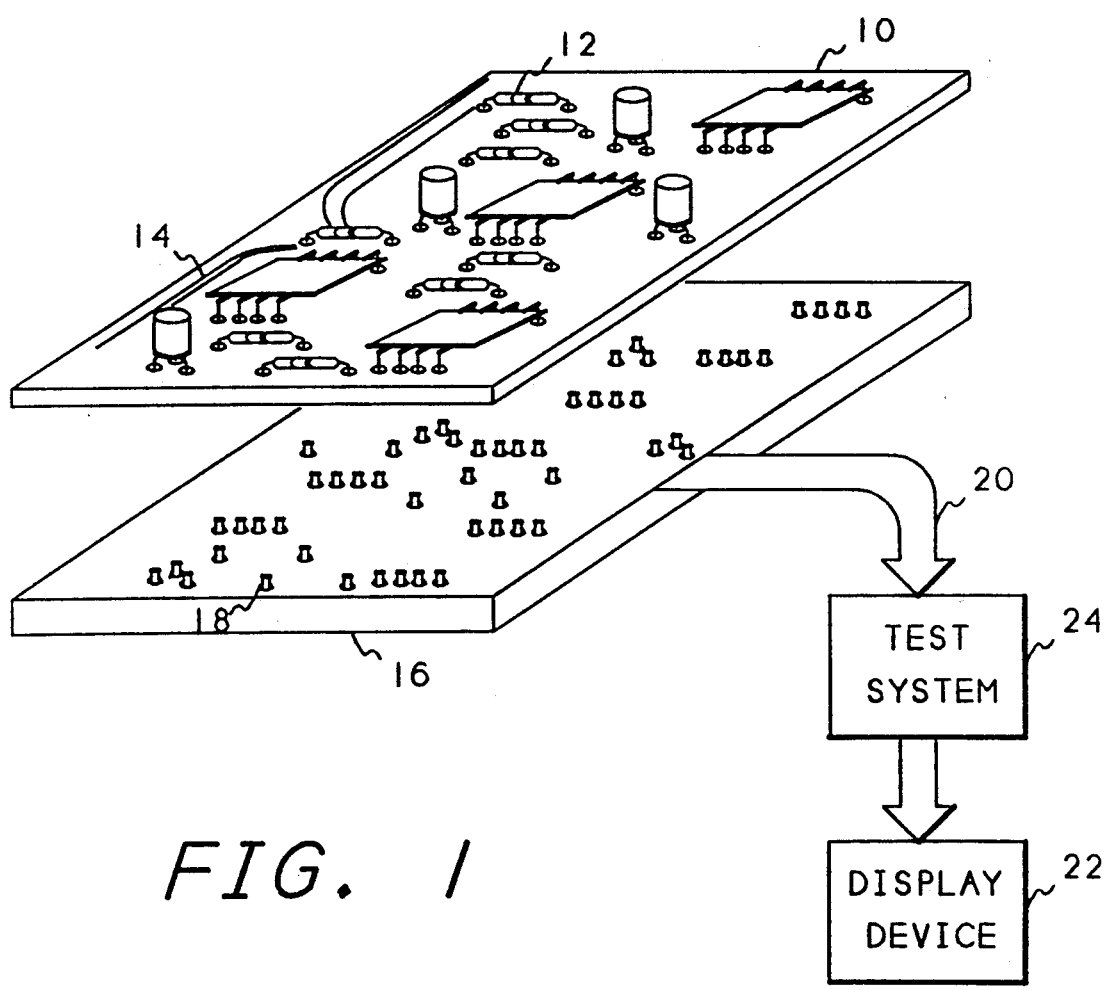
FIG. 1 shows a schematic overall view of an implementation of the device of the present invention.

FIG. 1 shows a schematic overall view of an implementation of the device of the present invention. Referring now to FIG. 1, printed circuit board 10 has a plurality of both analog and digital components 12 connected by way of the component leads through a plurality of conductors 14 that form a circuit on the printed circuit board 10. Test bed 16 has a plurality of connector pins 18 that function to contact conductors 14 at predetermined locations to apply test signals and detect responses at predetermined locations within printed circuit board 10. Conductors 20 connect the test bed pins 18 to test system 22. Test system 22 includes the necessary signal generators and signal processing equipment to perform the operations and analysis of the present invention and provide a display for display device 24 to indicate any defects that may exist in the circuit of printed circuit board 10.

Figure 2:
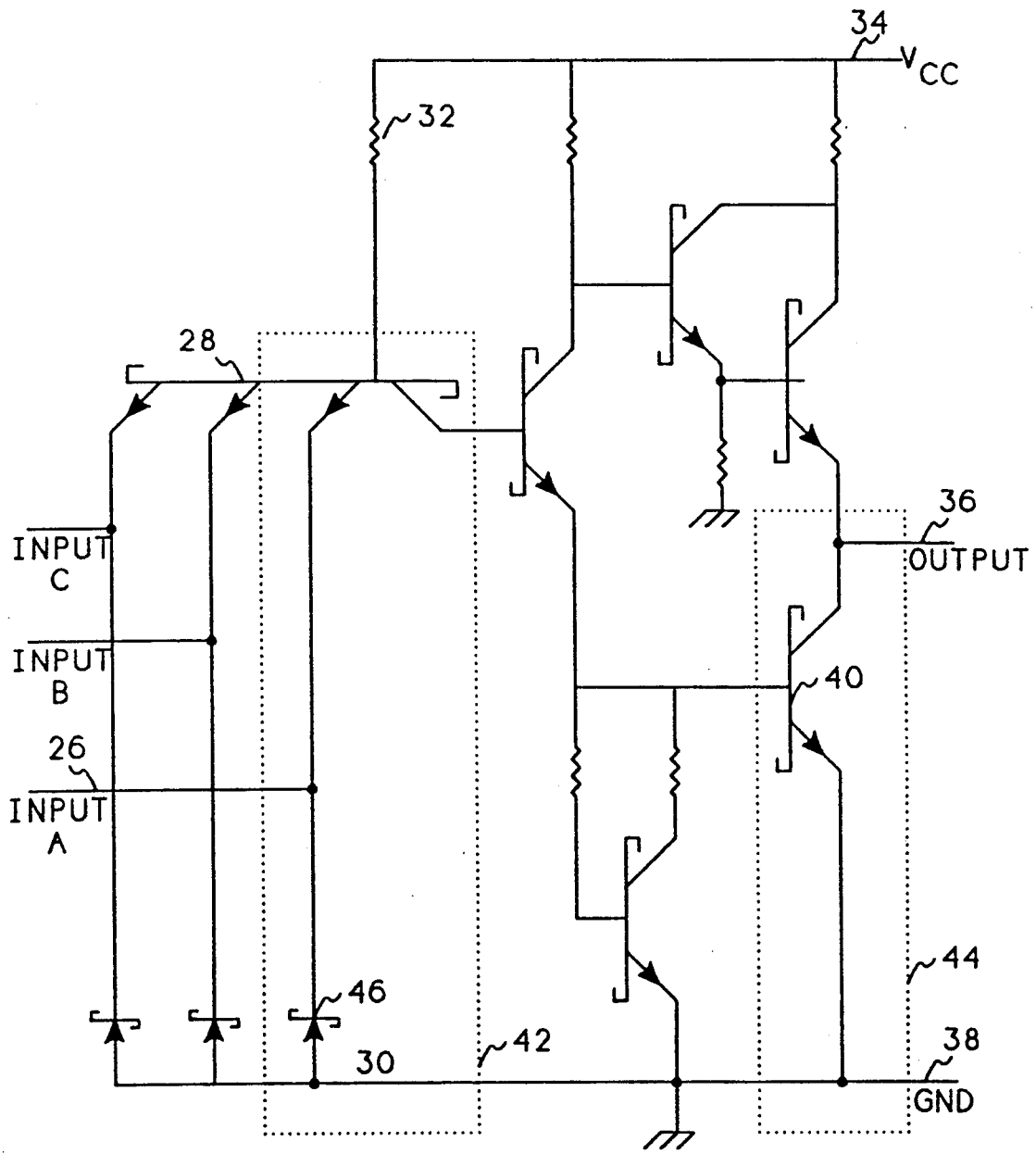
FIG. 2 is a partial schematic diagram of a typical TTL circuit.

FIG. 2 shows a partial schematic diagram of a typical prior art Schottky TTL circuit within an integrated circuit component. The circuit illustrated in FIG. 2 can be implemented in TTL or MOS components, such as complimentary metal oxide semiconductors (CMOS). Although the circuit illustrated in FIG. 2 may be implemented slightly differently in CMOS circuitry and may function slightly differently, the overall configuration and overall functional capabilities are generally similar to TTL implementation. Hence, the present invention may be implemented with slight variations for use with CMOS components.

Referring now to FIG. 2, the input 26 of the TTL circuit of FIG. 2 is connected to transistor 28 and protection diode 30. Resistor 32 is coupled to VCC input 34 and the base lead of transistor 28. Output 36 is connected to the collector of transistor 40.

Figure 3:
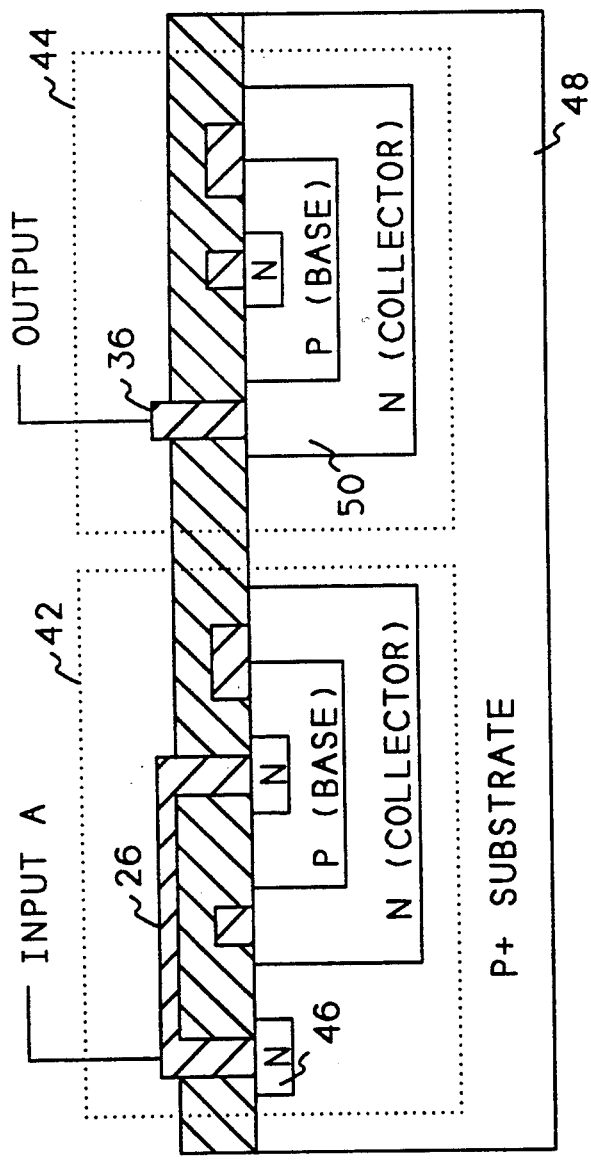
FIG. 3 shows a cross-section of the substrate of an integrated circuit and illustrates how a parasitic lateral transistor is formed.

FIG. 3 shows a cross-sectional view of two of the components of FIG. 2. Referring now to FIG. 3, dashed line 42 surrounds an area that forms the transistor 28 and protection diode 30 of FIG. 2. Dashed line 44 surrounds an area that forms the transistor 40 of FIG. 2. A parasitic lateral NPN transistor is formed by the cathode 46 of the protection diode 30, which can act either as a collector or an emitter, the substrate 48, which acts as a base, and the collector 50 of the output transistor 40, which acts as a collector or emitter. Although the parasitic lateral transistor thus formed has very poor characteristics, with a beta of typically 0.01, it is capable of serving the testing function of the present invention. Many different lateral transistors are formed in this manner on every integrated circuit, thus the present invention can be used to test for connections to most of the input and output pins of an integrated circuit.

Figure 4:
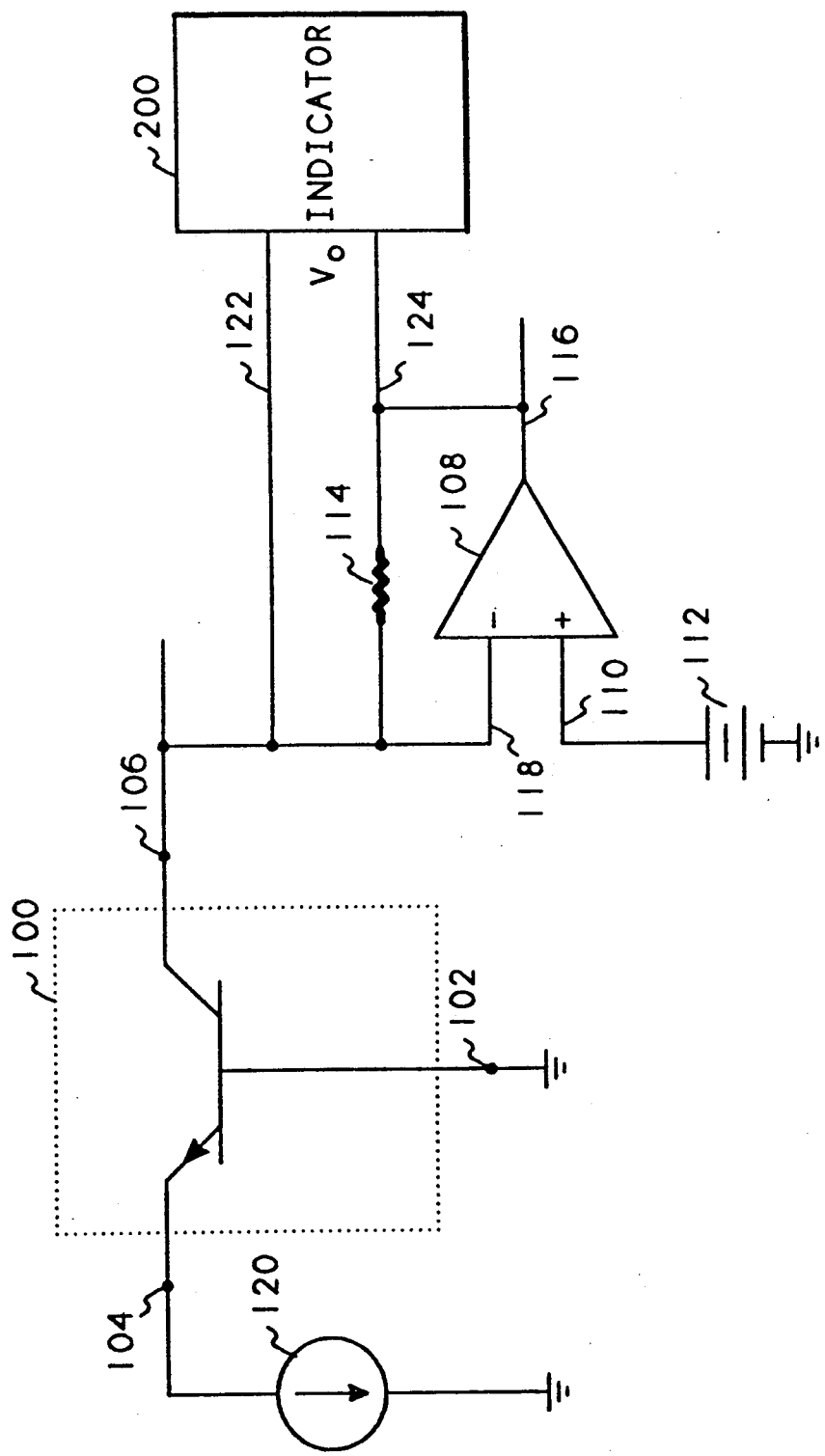
FIG. 4 illustrates the implementation of the present invention showing the device under test represented as a lateral transistor circuit.

FIG. 4 shows a schematic diagram of the present invention. Referring now to FIG. 4, an integrated circuit device under test (DUT) 100 has a ground pin 102 and pair of test pins 104 and 106. Each of the pins 102, 104, and 106 can be connected to multiple pins of an integrated circuit. An op amp 108 has its non-inverting input 110 connected to a battery or other constant voltage source 112 to supply a constant voltage to the non-inverting input 110. A feedback resistor 114 is connected between the output 116 of the op amp and the inverting input 118 of the op amp. The inverting input 118 is also connected to test pin 106 of the device under test 100. The other pin 104 of the device under test is connected to a current source 120. The op amp 108 will cause the inverting input 118 to maintain the same voltage as the non-inverting input 110. The voltage must be sufficient to reverse bias the collector-base junction of the lateral transistor, and is typically 0.2 volts.

Once the circuit is connected as shown in FIG. 4, the voltage on test pin 106 will rise to the voltage of the inverting input 118 of the op amp 108, and the amount of current flowing into the device under test 100 through pin 106 can be measured by measuring the voltage across feedback resistor 114 at the output terminals 122 and 124. Once the circuit has come to a stable state, a current pulse is supplied to pin 104 by current source 120. Output terminals 122 and 124 are monitored by an indicator 200 while the current pulse is being applied to pin 104, and if a current pulse is also seen through resistor 114 as measured by the voltage on the output terminals 122 and 124, then pins 106, 104, and 102 must all be connected to the printed circuit board.

Typically the pins 104 and 106 on the device under test 100 will be adjacent each other, however, the system will work so long as both these pins are connected to the same substrate within the integrated circuit. Should the integrated circuit being tested contain multiple substrates, and should the pins being tested be located on different substrates, then there will be no lateral transistor formed within the substrate and the system will not work properly. Because the lateral transistor 100 is not intentionally formed in the device under test, but is formed by a protection diode and a parasitic diode, the system does not rely on the actual circuit contained within the device under test. Because the current being measured across the feedback resistor 114 does not pass through the ground pin 102, the number of actual ground pins present in the device under test 100 does not substantially affect the operation of the system. Also, because the current is restricted to that flowing through the lateral transistor between pins 104 and 106, the fan out of the internal circuit has very little effect on the operation of the system.

In some circuits, typically CMOS, an additional regulated power supply must be connected between VCC and ground of the device under test. This supply is typically set to −0.3 volts for proper operation of the circuit.

In an alternative embodiment, current source 120 is replaced by a negative voltage source. This negative voltage source serves to supply the current pulse through the NPN lateral transistor.

Figure 5:
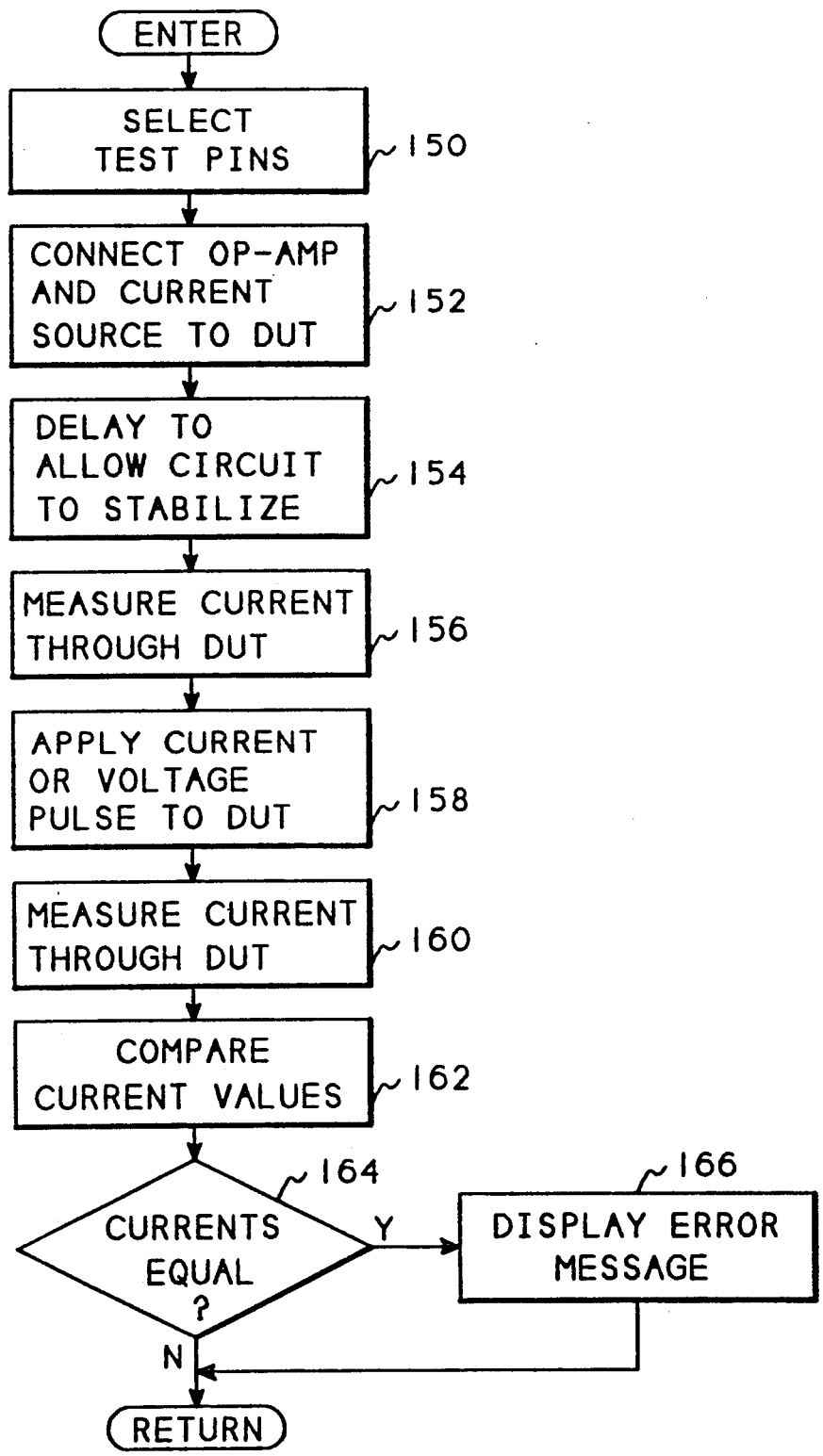
FIG. 5 is a flowchart showing the process of the invention.

FIG. 5 shows a flowchart of the operation of the present invention. Referring now to FIG. 5, after entry, block 150 selects the pins to be tested on the device under test. Block 152 then connects the op amp circuit and the current source to the device under test, and block 154 delays approximately 10 microseconds to allow the op amp circuit and the parasitic lateral transistor to stabilize. After the delay, block 156 measures the current going into the lateral transistor DUT by measuring the voltage across resistor 114 (FIG. 2). Block 158 then applies a current pulse, typically 20 milliamps, or a voltage pulse, typically −1.5 volts, to the emitter pin of the device under test. Block 160 then measures the current going through the DUT by measuring the voltage across resistor 114, and block 162 compares the current value measured during the application of the current or voltage pulse, to the current value measured while the circuit was stabilized. If these two currents are equal, block 164 transfers to block 166 to display an error message to indicate that the device under test is not connected to the printed circuit board. If the currents are not equal, meaning that the current or voltage source 120 caused additional current to flow into the lateral transistor through pin 106, then the device under test is connected and block 164 simply returns to complete the test.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. A system for testing a semiconductor integrated circuit component to determine whether first and second connector pins and a substrate connection pin of said semiconductor integrated circuit component are conductively connected to a circuit and whether proper conductive paths exist between said pins through said semiconductor integrated circuit component, said system comprising:

constant voltage source means having a first connection to said substrate connection pin of said semiconductor integrated circuit component;

current source means connected between said second connector pin of said semiconductor integrated circuit component and said substrate connection pin of said semiconductor integrated circuit component; and current measuring means connected between a second connection of said constant voltage source means and said first connector pin of said semiconductor integrated circuit component for measuring a current change whenever said current source supplies a current pulse to said second connector pin of said semiconductor integrated circuit component.

2. The system of claim 1 further comprising indicator means for indicating an error condition whenever said current measuring means indicates no current change.

3. The system of claim 1 wherein said constant voltage means and said current source means are connected to adjacent connector pins of said semiconductor integrated circuit component.

4. A system for testing a semiconductor integrated circuit component to determine whether first and second connector pins and a substrate connection pin of said semiconductor integrated circuit component are conductively connected to a circuit and whether proper conductive paths exist between said pins through said semiconductor integrated circuit component, said system comprising:

first constant voltage source means having a first connection to said substrate connection pin of said semiconductor integrated circuit component;

second voltage source means connected between said substrate connection pin of said semiconductor integrated circuit component and said second connector pin of said semiconductor integrated circuit component; and current measuring means connected between a second connection of said first constant voltage source means and said first connector pin of said semiconductor integrated circuit component for measuring a current change whenever said second voltage source supplies a pulse to said second connector pin of said semiconductor integrated circuit component.

5. The system of claim 4 further comprising indicator means for indicating an error condition whenever said current measuring means indicates no current change.

6. The system of claim 4 wherein said first constant voltage source means and said second voltage source means are connected to adjacent connector pins of said semiconductor integrated circuit component.

7. A method for testing a semiconductor integrated circuit component to determine whether first and second connector pins and a substrate connection pin of said semiconductor integrated circuit component are conductively connected to a circuit and whether proper conductive paths exist between said connector pins and said substrate connection pin through said semiconductor integrated circuit component, said method comprising the steps of:

applying a constant voltage between said first connector pin of said semiconductor integrated circuit component and said substrate connection pin of said semiconductor integrated circuit component, said voltage being sufficient to reverse bias a collector-base junction of a lateral transistor formed in said semiconductor integrated circuit component;

waiting a predetermined amount of time;

applying a predetermined current pulse between said second connector pin of said semiconductor integrated circuit component and said substrate connection pin of said semiconductor integrated circuit component; and measuring any increase in current flowing into said first connector pin of said semiconductor integrated circuit component.

8. The system of claim 7 further comprising the step of indicating an error condition whenever said measuring step indicates no current change.

9. The system of claim 7 further comprising the step of connecting said constant voltage and said current pulse to adjacent connector pins of said semiconductor integrated circuit component.

10. A method for testing a semiconductor integrated circuit component to determine whether first and second connector pins and a substrate connection pin of said semiconductor integrated circuit component are conductively connected to a circuit and whether proper conductive paths exist between said connector pins and said substrate connection pin through said semiconductor integrated circuit component, said method comprising the steps of:

applying a constant voltage between said first connector pin of said semiconductor integrated circuit component and said substrate connection pin of said semiconductor integrated circuit component, said voltage being sufficient to reverse bias a collector-base junction of a lateral transistor formed in said semiconductor integrated circuit component;

waiting a predetermined amount of time;

applying a predetermined voltage pulse between said second connector pin of said semiconductor integrated circuit component and said substrate connection pin of said semiconductor integrated circuit component; and measuring any increase in current flowing into said first connector pin of said semiconductor integrated circuit component.

11. The system of claim 10 further comprising the step of indicating an error condition whenever said measuring step indicates no current change.

12. The system of claim 10 further comprising the step of connecting said constant voltage and said voltage pulse to adjacent connector pins of said semiconductor integrated circuit component.

* * * * *